United States Patent
Loh et al.

(12)
(10) Patent No.: US 6,420,691 B1
(45) Date of Patent: Jul. 16, 2002

(54) CHARGE-COUPLED DEVICE FOR LOW BACKGROUND OBSERVATIONS

(75) Inventors: Edwin D. Loh, Okemos, MI (US); Edward S. Cheng, Lanham, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/349,898

(22) Filed: Jul. 8, 1999

Related U.S. Application Data

(60) Provisional application No. 60/092,489, filed on Jul. 8, 1998.

(51) Int. Cl.[7] .................... H01L 27/148; H01L 31/0232
(52) U.S. Cl. .................... 250/208.1; 257/437; 348/311
(58) Field of Search .................... 250/208.1, 214 R, 250/214.1, 214 A, 338.4; 257/225, 294, 432, 435, 436, 437; 348/298, 311, 314

(56) References Cited

U.S. PATENT DOCUMENTS

| 5,456,762 A | * 10/1995 | Kariya et al. ................ 257/55 |
| 5,693,968 A | * 12/1997 | Cherry et al. ............... 257/231 |
| 6,075,256 A | * 6/2000 | Kaifu et al. ................ 257/291 |

\* cited by examiner

*Primary Examiner*—Kevin Pyo

(57) ABSTRACT

A charge-coupled device with a low-emissivity metal layer located between a sensing layer and a substrate provides reduction in ghost images. In a typical charge-coupled device of a silicon sensing layer, a silicon dioxide insulating layer, with a glass substrate and a metal carrier layer, a near-infrared photon, not absorbed in the first pass, enters the glass substrate, reflects from the metal carrier, thereby returning far from the original pixel in its entry path. The placement of a low-emissivity metal layer between the glass substrate and the sensing layer reflects near infrared photons before they reach the substrate so that they may be absorbed in the silicon nearer the pixel of their points of entry so that the reflected ghost image is coincident with the primary image for a sharper, brighter image.

9 Claims, 5 Drawing Sheets

CCD With Extra Metal Layer

CCD With Extra Metal Layer

CCD Without Extra Metal Layer

CHARGE-COUPLED DEVICE FOR LOW BACKGROUND OBSERVATIONS

CROSS-REFERENCE TO RELATED APPLICATIONS

This application claims the benefit of priority under 35 U.S.C. §119 (e) of U.S. Provisional patent application 60/092, 489 filed Jul. 8, 1998, entitled "CCD System Technology for Extremely Low Background Observations," which is hereby incorporated by reference.

GOVERNMENT RIGHTS

The invention described herein was made in the performance of work under a NASA grant NAG5-3218 and by an employee of the United States Government and is subject to Public Law 96-517 (35 U.S.C. 200 et seq.) and may be manufactured and used by or for the Government for governmental purposes without the payment of any royalty thereon or therefor.

BACKGROUND

FIELD OF THE INVENTION

The field of the invention is charge-coupled devices.

Charge-coupled devices (CCDs) have proven to be exceptionally versatile and effective detectors from the near-ultraviolet through the near infrared. As demands for detector format or size and sensitivity increase, a number of problems have become the limiting factor for low-background observations. With larger detector formats, for example 4096×4096 photosensors or pixels, the problem of cooling to reduce dark current from bulk silicon layers of a typical CCD has become challenging because the exposed area of the device presents a large surface for absorption of thermal infrared photons from the environment.

CCD readout noise, which is introduced by the readout amplifier and the electronics outside the detector when reading a pixel without any photoelectrons, is a second limitation for low-background observations, especially when the devices can be cooled to their optimal operating temperature.

Charge-coupled devices (CCDs) have been used for astronomical observations since the 1970s. Their high quantum efficiency, low noise, relative stability and ease of use have brought about dramatic improvements in observational efficiency for ground based and space observations, culminating in the unprecedented discoveries made by missions such as the Hubble Space Telescope (HST). Space-based telescopes are more likely to be photon starved than their ground-based counterparts so that detector quantum efficiency is a greater factor in discovery potential. Typical requirements for space instruments such as the Space Telescope Imaging Spectrograph (STIS) on the HST are <25 electrons/hr/pixel dark current and <4 electrons/pixel readout noise.

Three sources of noise in a typical CCD detector are photon noise, dark current and readout noise.

Dark current is caused by thermally excited electrons, which are collected by the CCD pixel wells in the same way as photoelectrons are collected. FIG. 3 shows the relationship between dark current and temperature. The dark current drops very rapidly with decreasing temperature. The emissivity of a typical silicon backside-illuminated, thinned CCD can be high (i.e. 0.66). Although silicon has no absorption in the thermal infrared, the silicon is attached to a glass substrate, and $SiO_2$, the main constituent in glass, has a strong absorption band from 200–2000 $cm^{-1}$ that covers the thermal infrared band. Also, there may be a 1 um-thick layer of $SiO_2$ for electrical insulation, and this layer also absorbs some thermal radiation. A typical photon in the thermal infrared is absorbed within tens of micrometers of entering the glass substrate. For longer integration times (i.e. >1000 seconds), the dark current becomes significant.

The total noise in a CCD system can be modeled as:

$$n_t = (n_s + (Dt) + n_r^2)^{1/2}$$

Where $n_t$ is the total noise for a pixel, $n_s$ is the number of photoelectrons, D is the dark current in electrons/pixel/second, t is the integration time in seconds, and $n_r$ is the readout noise in electrons. Additional noise may also be generated by the environment of the detector, such as cosmic rays.

Because of its simple operation, the CCD detectors are used for many observations between 800 and 1000 nm but ghost images in these wavelength ranges reduce quantum efficiency. In the near infrared, 800–1000 nm, a sizable fraction of the light passes through the CCD without being absorbed and converted into free electrons. The absorption length in silicon is greater than the thickness of a typical CCD silicon layer of 13 um so that for wavelengths longer than 800 nm, less than 1/e of the light is absorbed in the first pass. At $\lambda < 600$ nm, all of the light that enters the CCD is detected (some of the light is reflected off of the silicon-vacuum interface), but at 900 nm, the quantum efficiency is much reduced, typically about 30%. The result is that the light that is not absorbed during the first pass through the silicon forms a ghost image, which is enlarged and, if the focal plane is tilted, displaced from the pixel nearest its point of entry into the CCD detector.

It is desired to decrease the dark current and readout noise to increase overall quantum efficiency of a charge-coupled device system in low background or low photon environments, and in particular, to reduce ghost images caused by light not immediately absorbed by the silicon.

SUMMARY

The addition of a low emissivity reflecting layer to a typical charge-coupled device has improved overall quantum efficiency. The present invention is a charge-coupled device comprising a substrate, a sensing layer and a reflecting layer wherein the reflecting layer is positioned between the sensing layer and the substrate. The reflecting layer may be a metal such as aluminum for example. Typically the substrate will be a glass substrate. The sensing layer will be silicon. In addition, an insulating layer of silicon dioxide will typically be positioned between the sensing layer and the metal reflecting layer.

A particular embodiment of the invention would comprise a charge-coupled device having a glass substrate have a front side and a back side. On its back side would be located a metal carrier layer and on its front side, the metal reflecting layer, typically aluminum. The other side of the metal reflecting layer would be adjacent to the silicon insulating layer which is positioned between the sensing layer and the metal reflecting layer.

It is also an object of the invention to provide a system that combines the above embodiments of the charge-couple device with a correlated double sampler that controls a readout rate for the device so that the rate may be slowed down to reduce readout noise.

DETAILED DESCRIPTION

Figure 1B:
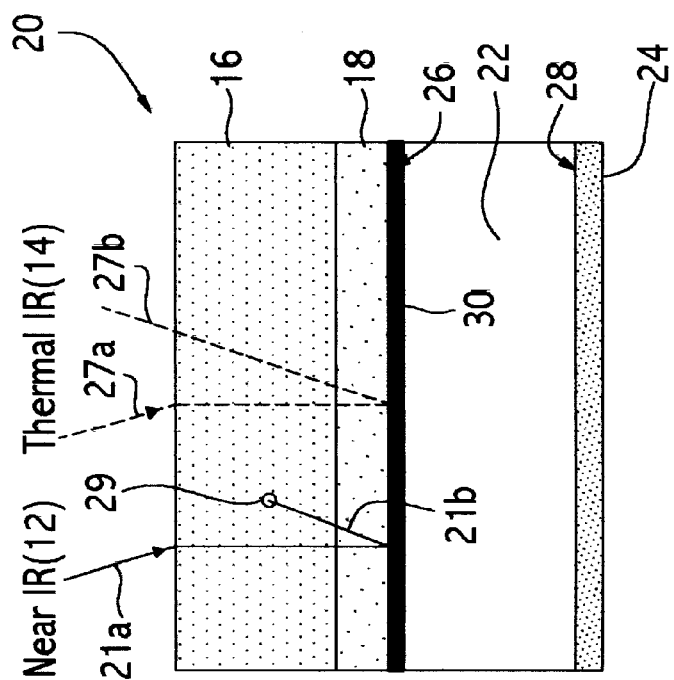
FIG. 1b shows the absorption of a near infrared photon (12) and a thermal infrared photon (14) in a cross-section of a typical charge-coupled device with the metal reflecting layer (20).
Figure 1A:
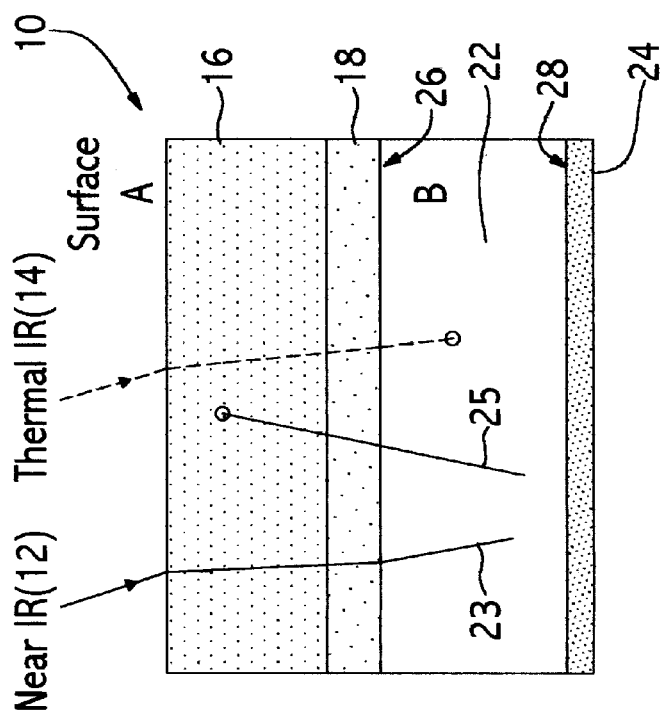
FIG. 1a shows the absorption of a near infrared photon (12) and a thermal infrared photon (14) in a cross-section of a typical charge-coupled device (CCD) without the metal reflecting layer (10).

FIG. 1a shows layers in a typical charge-coupled device (10) comprising an upper layer of silicon sensing material (16) here 0.013 mm thick. Beneath this layer is a silicon insulating layer of $SiO_2$ (18) which is 0.001 mm thick in this version, is located on a glass substrate (22) shown to be (0.750 mm in this example). The glass substrate has a front side (26) and a back side (28). Beneath the glass substrate is a metal carrier layer (24). A typical thermal infrared photon (14) is absorbed in the glass substrate. Also, a near infrared photon (12) makes a first pass (23) through the upper layers and reflects from the metal carrier. The near infrared photon may then be absorbed on a return path (25) in the silicon sensing layer, but far from an original pixel near where it entered so that it contributes to a ghost image.

FIG. 1b shows an embodiment of the present invention wherein a low-emissivity metal reflecting layer (30) is inserted between the $SiO_2$ insulating layer (18) and the glass substrate (22). In this embodiment, a thermal infrared photon is shown having a path (27a) ending at the metal reflecting layer where it is reflected in a return path (27b), so that it will not be absorbed by the glass substrate, thereby decreasing the dark current in the CCD. Furthermore, a near infrared photon (12) that is not absorbed in a first pass (21a) reflects back for a second pass (21b) nearer to the original pixel (29) it passed through so as to reinforce the image.

Table 1 shows an example of CCD layer structure comprising the metal reflecting layer. Use of the term metal backed CCD or modified CCD refers to embodiments of the present invention.

TABLE 1

| Layer | Material | Thickness (um) Standard CCD | Thickness (um) Modified CCD |
|---|---|---|---|
| 1 | Silicon sensing region | 13 | 13 |
| 2 | Silicon dioxide insulator | 0.1 | 0.1 |
| 3 | Polysilicon gate | 0.5 | 0.5 |
| 4 | Silicon dioxide insulator | 1.5 | 1.5 |
| 5 | Metal reflecting layer | none | 0.1 |
| 6 | Glass substrate | 700 | 700 |
| 7 | Metal Carrier | | |

For the embodiment shown in Table 1, initial results indicated that there was no essential difference measured for thermal infrared emissivity between the modified and a standard CCD. However, it was discovered that red light reflected from the CCD is diffracted by the periodic structure of shift registers in the CCD. Apparently a reflection spectrophotometer used in the measurement only measured the zeroth order reflection and missed the other orders.

Figure 2:
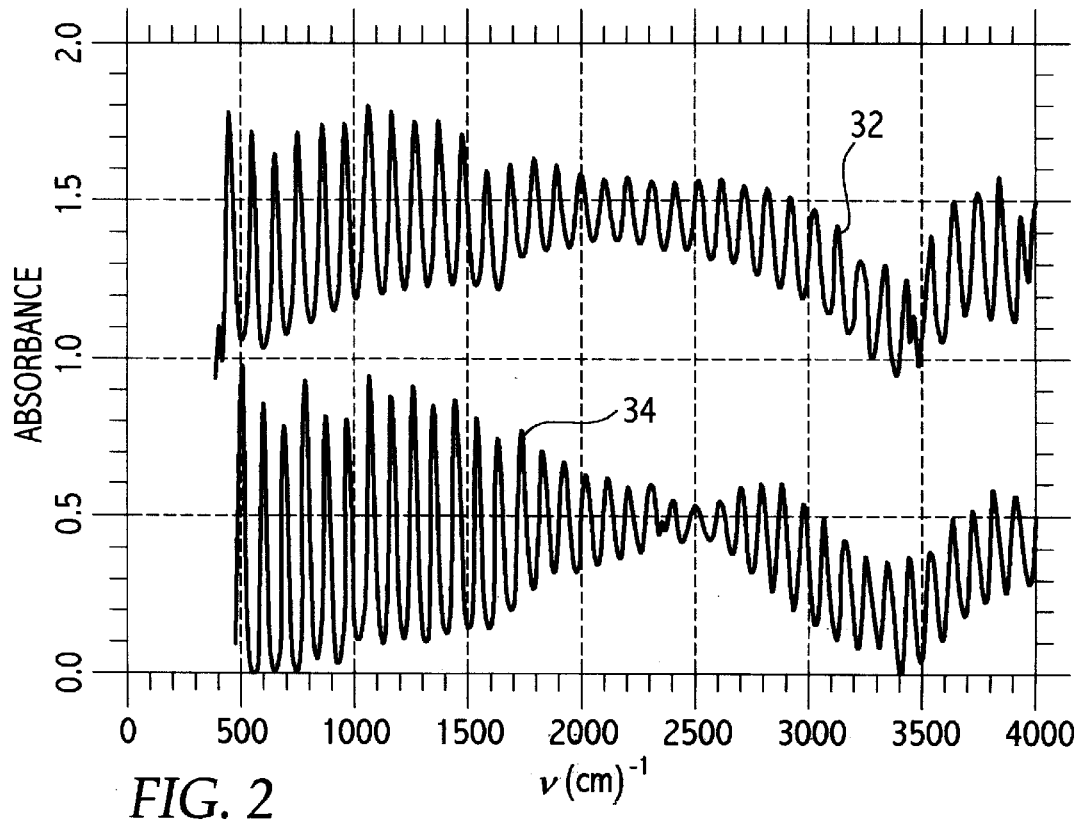
FIG. 2 shows the infrared absorbance of a typical CCD (32) and a metal-backed CCD (34).
Figure 3:
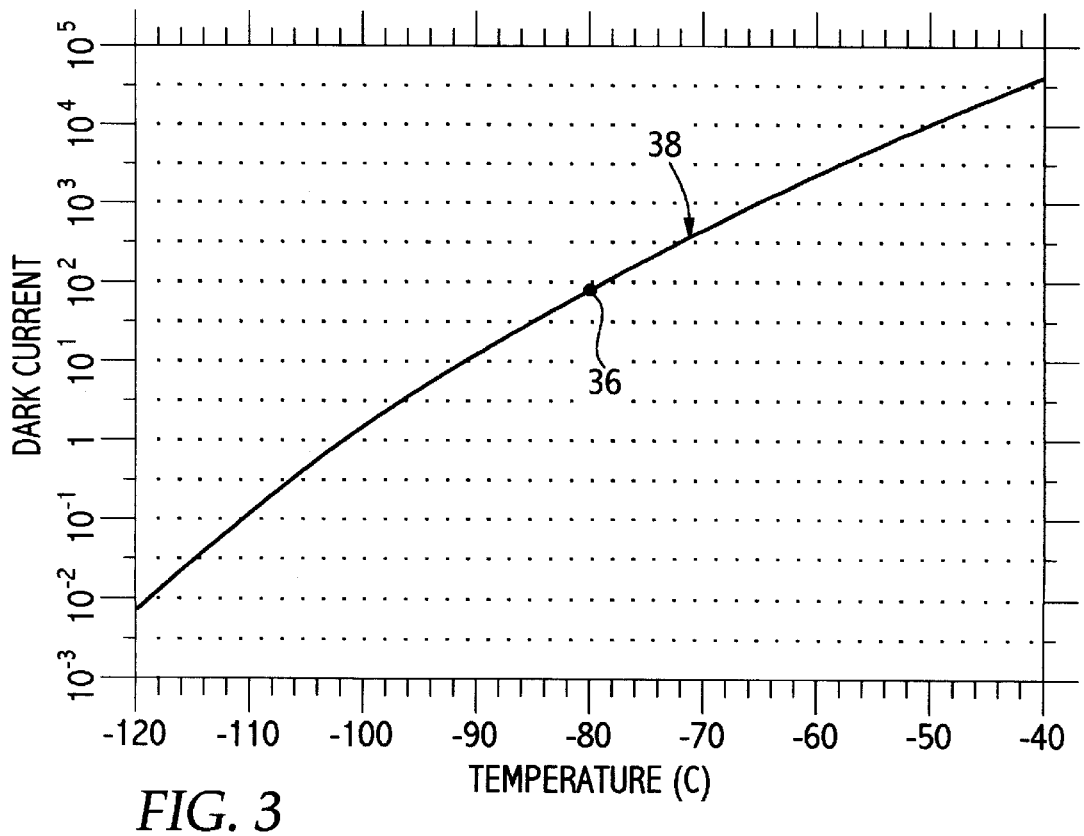
FIG. 3 shows the relationship between CCD dark current (38), normalized to −100° C., vs. temperature.

In the initial measurements, the infrared absorbance of the standard and modified CCDs from 500–4000 $cm^{-1}$ (20–2.5 u) were measured with a fourier-transform spectrophotometer. The results are shown in FIG. 2 showing the absorbance, normalized to $-\log_{10}$ (Reflected flux /Incident flux), versus v ($cm^{-1}$) for a standard CCD (32) in the top portion of the graph and for the modified CCD (34) in the bottom portion of the graph. The gross features of the absorbance are essentially the same for the two CCDs. The spacing between the interference fringes is about δv=100 $cm^{-1}$, which indicates the main reflection is between the back and front of the silicon. At v>3000 $cm^{-1}$, a finer spacing is evident for the standard CCD. Here, the light passes through the glass substrate and gives a spacing of δv=5.3 $cm^{-1}$. In the modified CCD, the metal layer prevents the light from entering the glass, and the fine fringes are not seen. The modified CCD was expected to have a much lower absorbance because much of the infrared light was not expected to reach the glass substrate, which is known to have a large infrared absorbtivity.

It was observed that the polysilicon gates, which had been ignored, also had a high infrared absorbtivity, because of the free charges. With the free charges, the index of refraction n is changed from $n_0$ to $$n=[n_0^2-(\omega_p^2\tau/\omega(\omega\tau+i)]^{1/2}$$

Where ω is the angular frequency, $\omega_p$ is the plasma frequency, and τ is the damping time. The index of refraction has an imaginary, absorptive term at all infrared wavelengths because $n^2$ has an imaginary part. Furthermore, at some wavelengths, the real part of $n^2$ is negative. One suggested solution was to make an embodiment wherein the metal reflecting layer be inserted between the silicon sensing region and the polysilicon gate layer. Modeling of the system was updated to include the absorption by the polysilicon layer.

In further analysis, it was discovered that the periodic structure of the CCD causes diffraction at wavelengths longer than 700 nm. Therefore, the reflection spectrophotometer does not measure the total reflectivity and underestimates the reflectivity.

Although the results for the thermal infrared light was not as expected, the metal-backed CCD did show improvement with respect to alleviating ghost images.

Figure 5:
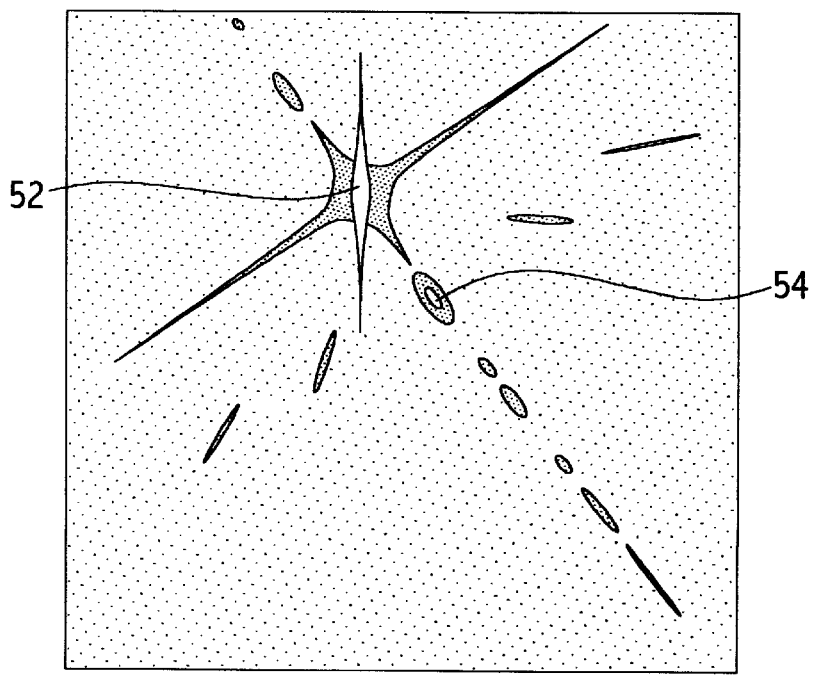
FIG. 5 shows the image of a white-light point source reflected from a CCD.

A white-light point source was imaged that reflected off of a CCD. In the picture of FIG. 5, there are many images, which can be labeled by the order numbers (n,m), where n and m count orders that are in the direction of the parallel and serial shift registers, respectively. The (0,0) image (52) is sharp and saturated as the angles of incidence and reflection are equal. Plain white indicates very bright intensities. The (1,0) order (54) to the southeast is also particularly bright. The other orders are elongated because of the spread in wavelength.

The diffracted peaks (n,m) with n changing are due to the structure making the parallel shift registers. This is the strongest diffraction. A weaker diffraction pattern with m changing is due to a structure perpendicular to the parallel shift registers. Perhaps, this is caused by the structure that defines the channel in which charge is confined.

Figure 6:
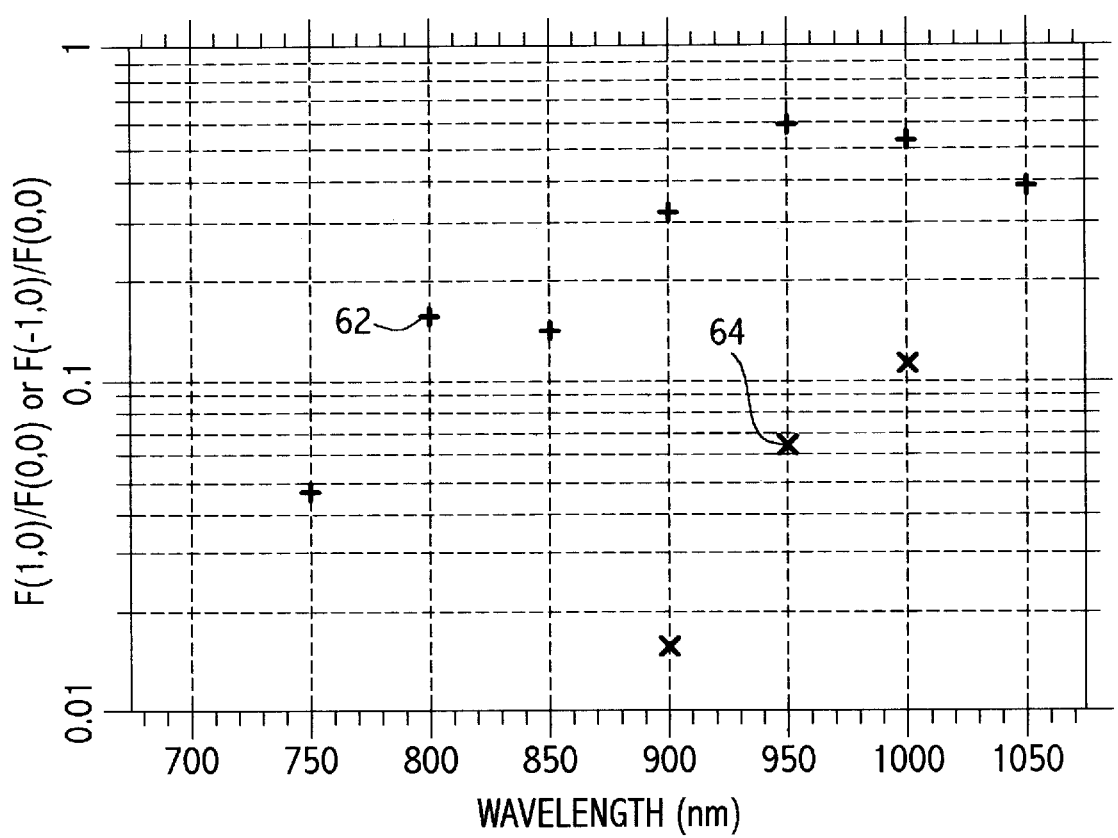
FIG. 6 is a plot of the intensity of the first order [+for (1,0); X for (−1,0)] diffraction peaks relative to the zeroth order peak for a metal-backed CCD.

The intensity of the (1,0) (62) and (−1,0) (64) peaks, as shown in FIG. 6, is complex. The diffraction cannot be detected at $\lambda<700$ nm. The reason is that the diffraction arises from the light that reaches the back. There are local maxima at 780 nm and 920 nm and a minimum at 840 nm. These are probably due to the interference caused by the step structure of the polysilicon electrodes. The (1,0) order is much brighter than the (−1, 0) order.

There is a substantial amount of light in the diffracted orders. The (1,0) order contains as much as 60% of the light in the zeroth order at near-infrared wavelengths accessible to the CCD. Therefore, it is likely that the thermal infrared reflectivity is substantially underestimated with the reflection spectrophotometer.

In a standard CCD, a substantial fraction of the light at long wavelengths ($\lambda>750$ nm) passes through the silicon detecting layer without being absorbed. That light passes into the glass substrate, reflects off of bubbles in the glass and the metal carrier, and returns through the sensing layer as a diffuse ghost image. In a metal-backed CCD, in contrast, the light that passes through the detecting layer reflects back at essentially the same pixel and gets a second chance to be absorbed, which results in a higher quantum efficiency.

Figure 4:
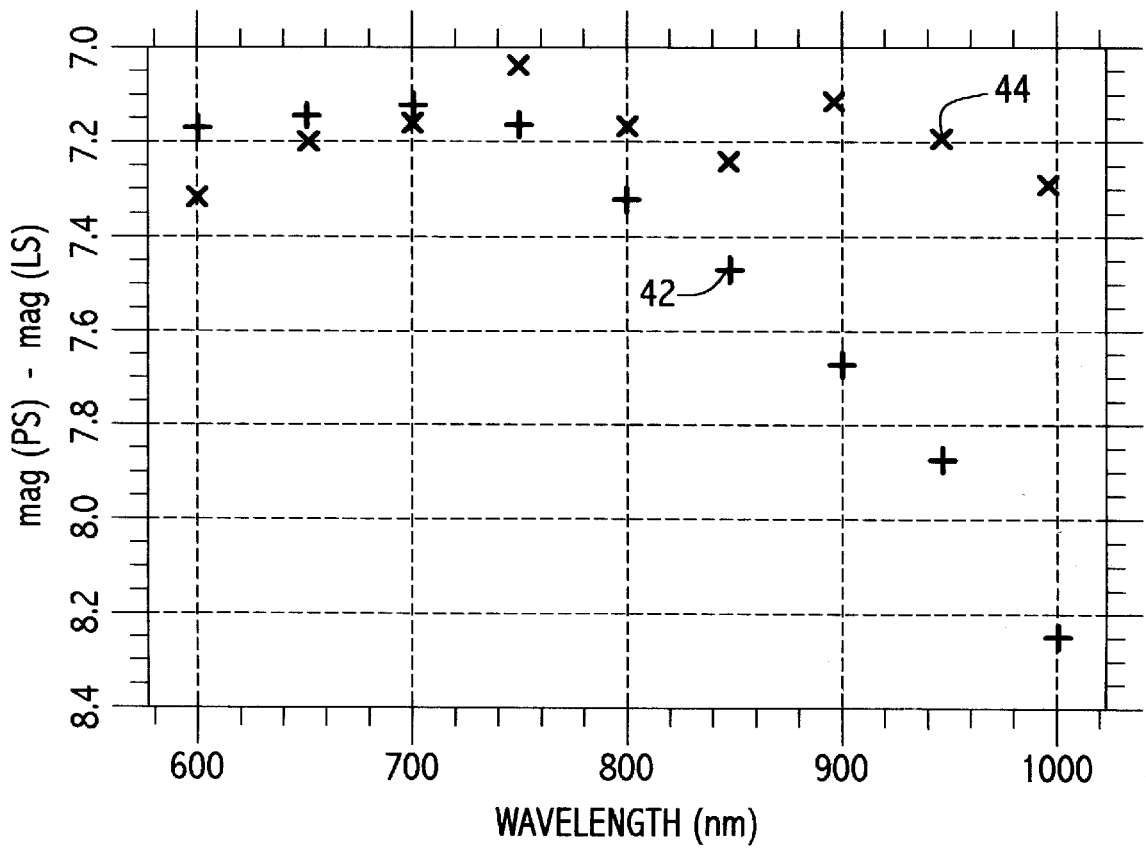
FIG. 4 shows the comparison between the magnitudes of a point source magnitude (PS) and a large source magnitude (LS) for a standard CCD (+) and a metal-backed CCD (X) as a function of color.

The improvement in efficiency of the metal-backed CCD was measured in the following way. A point source and a large source with a diameter of 50 pixels were imaged. The sources were made by placing a pin hole or a larger hole in front of a diffused light. The point source was photometered with an aperture of diameter of 8 pixels. Ideally, a detector should have the same efficiency regardless of the size of the image. For such a detector, the ratio of the fluxes of a point source and a large source should be the ratio of the areas of the two holes, and therefore should be independent of color. The measurements of the flux ratio expressed in magnitudes, mag(PS)−mag (LS), as shown in FIG. 4, for the standard (42) and metal-backed CCD's (44) show the differences. For the standard CCD, mag(PS)−mag(LS) is independent of color at $\lambda<700$ nm but falls at longer wavelengths. At 950 nm, it drops by 0.75 mag which is a factor of 2. As shown in FIG. 4, for the metal-backed CCD, mag (PS)−mag(LS) is independent of color.

The results indicate that there is no difference between a standard and metal-backed CCD at $\lambda<700$ nm as the photons are absorbed before they reach the metal backing. At $\lambda>700$ nm, the effective quantum efficiency depends on the size of the image for a standard CCD but not for a metal-backed CCD. For some astronomical problems, this is a serious problem for standard CCDs because a calibration made with a defocused star does not apply to in-focus stars. For background limited observations with the metal-backed CCD, there is a substantial improvement in detection limit beyond the gain in quantum efficiency. The additional gain arises because in a standard CCD, the photons that reenter the sensing layer far from where they entered contribute for the background but not for a star. Therefore, the improvement in detection limit scales as the ratio of the efficiencies for the metal backed and standard respectively, $\epsilon_{MB}/\epsilon_{STD}$, and not as the usual expression $(\epsilon_{MB}/\epsilon_{STD})^{1/2}$. At 950 nm, the detection limit improves by 0.75 mag.

Figure 7:
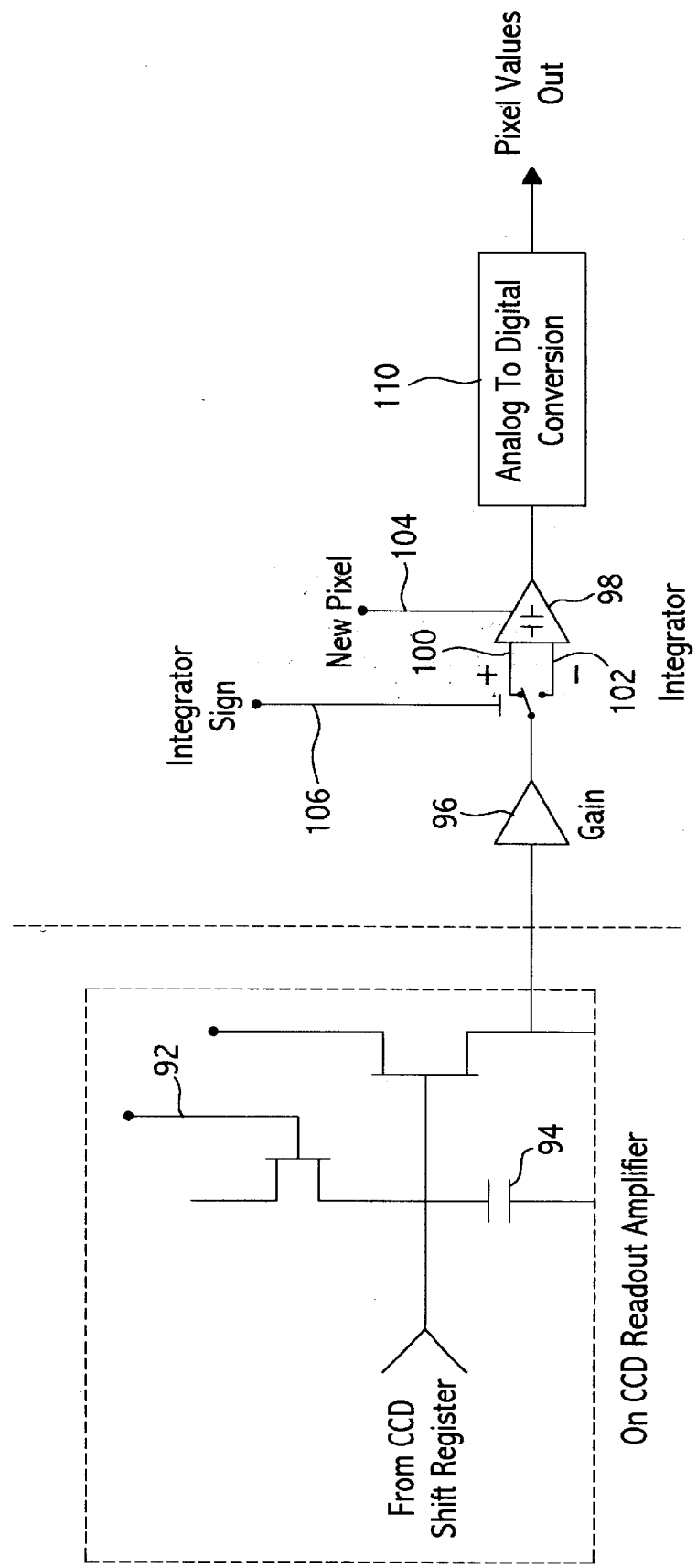
FIG. 7 is a block diagram for the integrating correlated double sampler readout electronics.

FIG. 7 shows a block diagram for the proposed integrating correlated double sampler readout electronics. The detailed schematics of the basic integrator and circuitry for introducing dead time are not shown.

The readout noise, that which arises by reading a pixel without any photoelectrons, can be minimized by sampling or filtering the signal suitably. The problem is to adjust the filter to the noise power spectrum of the on-chip amplifier. An added constraint is that the time allowed for sampling is fixed, and it is essential to take the difference between the signal with and without the detected photoelectrons to avoid a large "capacitance noise," $f^{-1}$. For a noise power spectrum that is proportional to $f^1$, the readout noise is independent of the sample frequency s. On the other hand, for a noise power spectrum that is independent of frequency, the readout noise is proportional to $s^{1/2}$.

For early CCD's, the amplifier noise power was indeed $f^{-1}$, and the readout noise was independent of sampling rate; amplifiers have improved in the readout noise. For the amplifier on a typical CCD, the f−1 noise and white noise are comparable at 9 KHz. For the correlated double sampler, which is described below, the readout noise with these amplifiers can be improved substantially by slowing the readout rate.

A lower readout noise yields a substantial improvement in performance. If the sampling rate were slowed from 50 KHz to 20 KHz, the noise would be reduced by a factor of 1.4. Additional improvements are possible with further reduction in the readout rate, but the exact improvement depends on the detailed noise characteristics of the readout amplifier. For long, photon-starved exposures where the readout noise dominates, the extra readout time is a small fractional increase, and the required integration time would be lowered by up to a factor of 2 (depending on the sky background and dark current contributions). For short integrations, the rate can be commanded to a large value (up to 100 Khz) since the source would be bright and noise is not an issue.

The proposed integrating correlated double sampler (FIG. 7) is similar to the standard "correlated double sampling" method, but has the additional feature that the noise is processed in a true integrator during each of the two signal phases. This allows for easy implementation of a commandable readout rate to optimize an observation. The sequence for reading the charge on a picture element is as follows: 1) the on-chip capacitor (94) is discharged by the reset switch (92), and the integrator capacitor (98) is discharged (104). 2) Before the charge packet is shifted onto the on-chip capacitor, the signal level is integrated on the integrator capacitor with a negative sign for a fixed time by connecting to the negative sign input (102). 3) After the charge packet arrives on the on-chip capacitor, the signal level is integrated on the integrator capacitor with a positive sign by connecting to the positive sign input (100) for the same time. 4) The input to the integrator is removed, and the output is digitized via analog to digital converter (110). Thus, the integrator both filters and takes the difference between the signal level with and without the charge packet. With this design, the readout rate can easily be optimized for an observation without changing the fixed component values that are typically used to set the bandwidth of the standard correlated double sampler.

Obviously, many modifications and variations of the present invention are possible in light of the above teachings. It is therefore to be understood that within the scope of the appended claims the invention may be practiced otherwise than as specifically described.

What is claimed is:

1. A charge-coupled device comprising a substrate having a front side and a back side, a sensing layer, a metal carrier layer, and a reflecting layer wherein said reflecting layer is positioned between the sensing layer and the front side of the substrate and said metal carrier layer is positioned on the back side of the substrate.

2. The device of claim 1 wherein the reflecting layer is comprised of metal.

3. The device of claim 1 wherein the substrate is comprised of glass.

4. The device of claim 1 wherein the sensing layer is comprised of silicon.

5. The device of claim 1 further comprising an insulating layer positioned between the sensing layer and the reflecting layer.

6. The device of claim 1 wherein the substrate is a glass substrate, the sensing layer is comprised of silicon, the reflecting layer is comprised of metal and further comprising a silicon insulating layer positioned between the sensing layer and the reflecting layer, the reflecting layer being positioned on the front side of the glass substrate.

7. The device of claim 6 wherein the metal of the reflecting layer is aluminum.

8. A system comprising a charge-coupled device having a substrate having a front side and a back side, sensing layer, a metal carrier layer, and a reflecting layer wherein said reflecting layer is positioned between the sensing layer and the front side of the substrate and said metal carrier layer is positioned on the back side of the substrate; said charge-coupled device having a readout rate and a readout capacitor for transferring charges from photosensors of the device, said readout capacitor having a reset switch; and a correlated double sampler that controls a readout rate of the charge-coupled device, said sampler receiving a signal from the readout capacitor.

9. The system of claim 8 wherein the correlated double sampler has an integrator having positive and negative sign inputs and an analog to digital converter.

* * * * *